(12) United States Patent
Lin

(10) Patent No.: US 6,456,506 B1
(45) Date of Patent: Sep. 24, 2002

(54) ELECTRONIC RETAINER FOR PREVENTING ELECTROMAGNETIC INTERFERENCE AND CAPABLE OF BEING ABSORBED MECHANICALLY

(76) Inventor: Chiang Chun Lin, No. 9, Lane 90, Fu Hsing Rd., Lu Chou, Taipei Hsien (TW)

( * ) Notice: Subject to any disclaimer, the term of this patent is extended or adjusted under 35 U.S.C. 154(b) by 5 days.

(21) Appl. No.: 09/602,275

(22) Filed: Jun. 23, 2000

(51) Int. Cl.⁷ .................................................. H05K 9/00
(52) U.S. Cl. ....................... 361/816; 361/800; 361/818; 361/807; 174/35 R; 174/138 G
(58) Field of Search ................................. 361/799, 800, 361/803, 807–810, 816, 818; 174/35 R, 35 GC, 138 G; 138/89, 96 T; 411/55–57, 177–182

(56) References Cited

U.S. PATENT DOCUMENTS

| | | | |
|---|---|---|---|
| 3,574,312 A | * 4/1971 | Miller | 138/96 |
| 3,661,291 A | * 5/1972 | Hetzer | 220/42 R |
| 3,666,301 A | * 5/1972 | Jorn | 287/85 R |
| 3,814,135 A | * 6/1974 | Hetzer et al. | 138/89 |
| 4,179,038 A | * 12/1979 | Rosan, Jr. | 220/243 |
| 4,620,641 A | * 11/1986 | Beer | 220/288 |
| 4,726,722 A | * 2/1988 | Wollar | 411/32 |
| 5,048,181 A | * 9/1991 | Grider | 29/840 |
| 5,519,169 A | * 5/1996 | Garrett et al. | 174/35 R |
| 5,750,936 A | * 5/1998 | Wheatly et al. | 174/138 G |
| 5,926,357 A | * 7/1999 | Elias et al. | 361/302 |
| 6,218,611 B1 | * 4/2001 | Bias | 174/35 GC |

* cited by examiner

*Primary Examiner*—Kamand Cuneo
*Assistant Examiner*—Tuan Dinh
(74) *Attorney, Agent, or Firm*—Rosenberg, Klein & Lee

(57) ABSTRACT

An electronic retainer for preventing electromagnetic interference and capable of being absorbed mechanically is disclosed. The retainer has a through hole therein, and a temperature tolerant rubber piece is matched in the through hole. The temperature tolerant rubber piece is filled in the through hole of the retainer so that the retainer has a solid center. Therefore, the retainer can be absorbed by a robotic arm so that material-taking and assembly of the retainer is performed automatically. Thus, the manufacturing process is rapid and mass production can be achieved. Moreover, a screw passes through the through hole of the retainer and the fixing hole of the circuit board so that the retainer is fixed to a casing. By contacting of the screw 30 with the retainer 10, the circuit board may be electrically grounded through the tin ring, retainer, screw and the casing for achieving the object of preventing electromagnetic interference and thus the object of electromagnetic shielding is achieved. The retainer has the function of lifting the retainer, as the screw is rotated for fixing, it will not contact and rub the tin ring on the circuit board. Therefore, the tin ring will not be destroyed or drop out. Therefore, a preferred shielding effect is achieved.

4 Claims, 9 Drawing Sheets

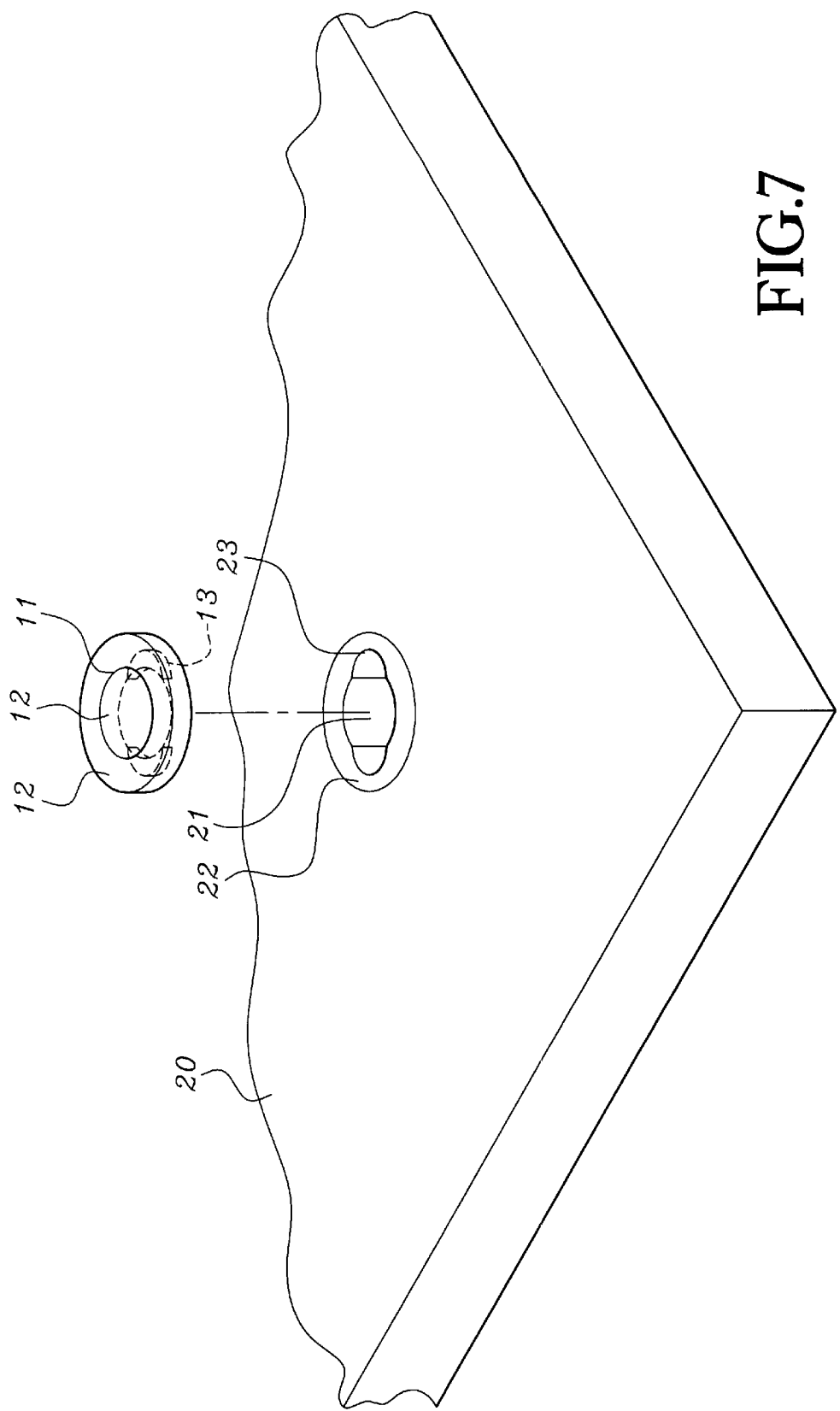

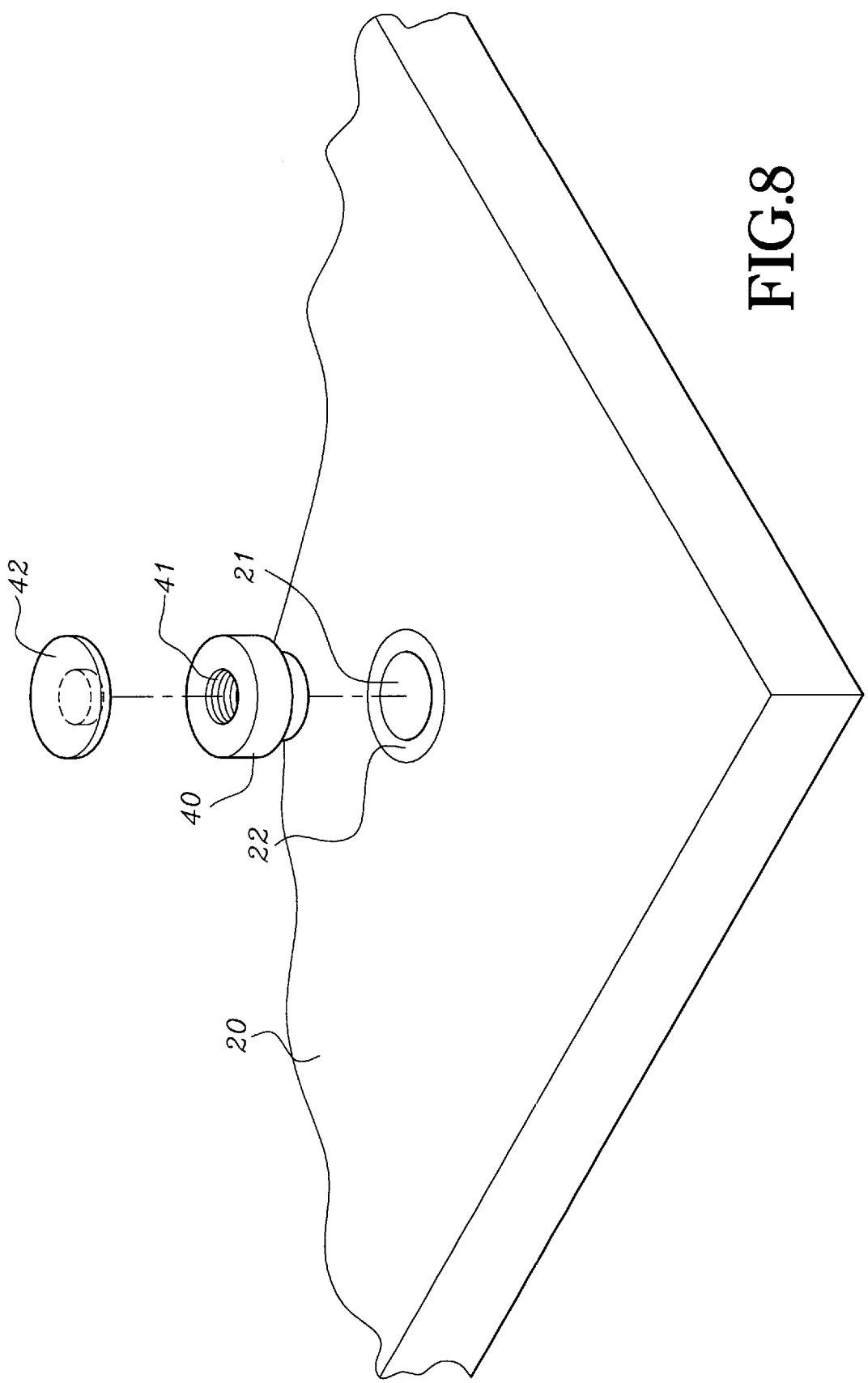

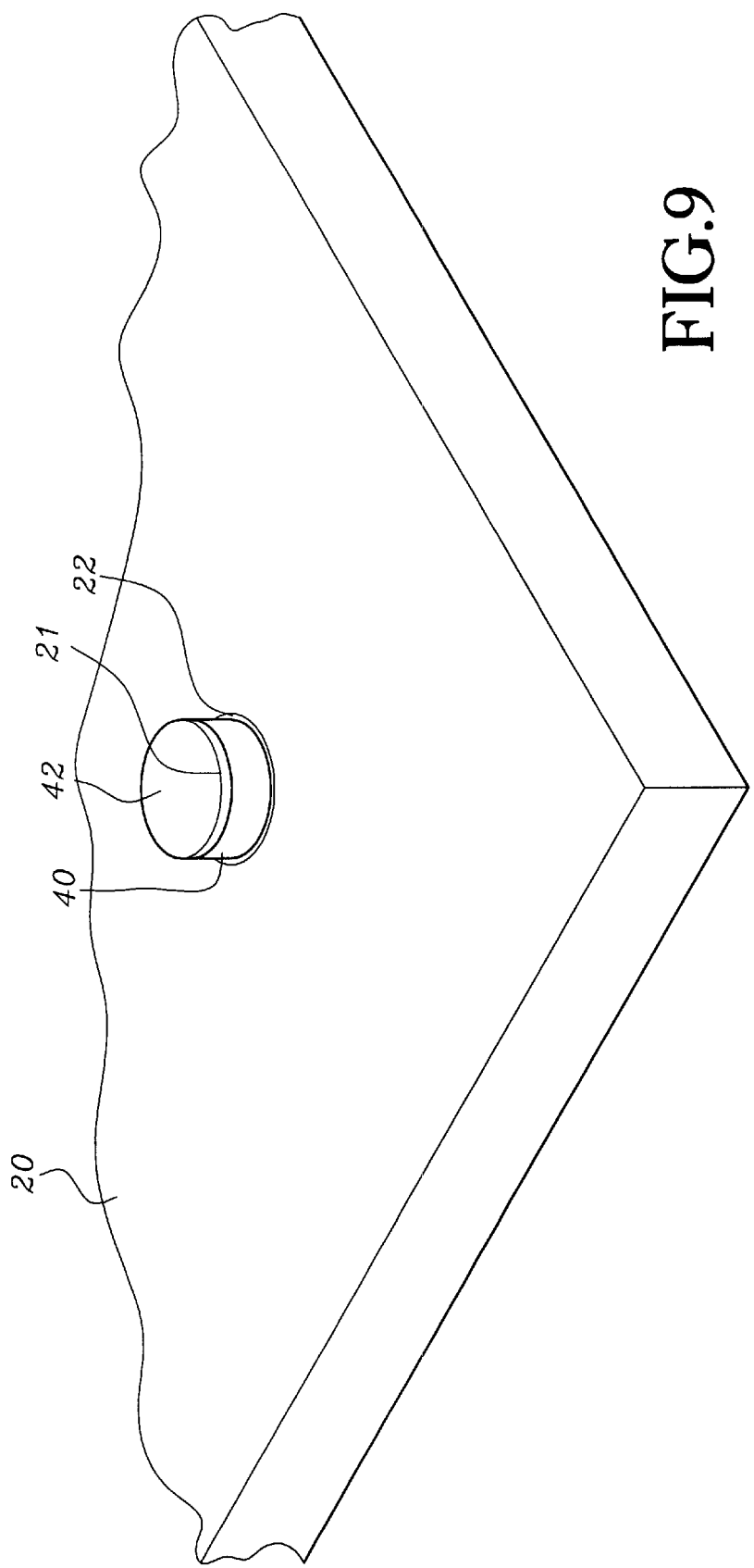

ELECTRONIC RETAINER FOR PREVENTING ELECTROMAGNETIC INTERFERENCE AND CAPABLE OF BEING ABSORBED MECHANICALLY

FIELD OF THE INVENTION

The present invention relates to a retainer for preventing electromagnetic interference and capable of being absorbed mechanically, and especially to a retainer which can be installed on a circuit board for achieving a preferred shielding effect. The retainer can be absorbed by a robotic arm so that material-taking and assembly of the retainer is performed automatically.

BACKGROUND OF THE INVENTION

As shown in FIG. 1, a prior art circuit board 10a can be fixed in the casing of an electronic device by a screw 11a. The circuit board 10a is formed with a fixing hole 12a. At the top of the circuit board 10a the outer rim of the fixing hole 12a is installed with a tin ring 13a. The screw 11a can pass through each fixing hole 12a and then the screw 11a is screwed into the casing so that the circuit board 10a is firmly secured to the casing by the screw 11a. By the contact of the screw 11 with the tin ring 13a, the circuit board 10a may be electrically grounded through the tin ring 13a, screw 11a, and the casing for achieving the object of preventing electromagnetic interference so as to achieve a preferred shielding effect. Moreover, by the tin ring 13a, as the screw 11a is locked, damage to the circuit board 10a will be prevented.

However, as the aforesaid prior art screw 11a is rotated for fixing, it will contact with and rub the tin ring 13a so as to destroy the tin ring and thus cause the tin ring to drop off. Therefore, the circuit board 10a can not be substantially electrically grounded through the tin ring 13a, screw 11a and casing. Therefore, the shielding effect is bad.

Accordingly, there is an eager demand for a novel electronic retainer for preventing electromagnetic interference and capable of being absorbed mechanically which can improve the defects of the prior art.

SUMMARY OF THE INVENTION

Accordingly, the primary object of the present invention is to provide a retainer for preventing electromagnetic interference and capable of being absorbed mechanically, which can be installed on the circuit board. As the screw is rotated for fixing, it will not contact with and rub the tin ring on the circuit board. Therefore, the tin ring will not be destroyed or drop out. Thus, a perfect shielding effect is achieved.

Another object of the present invention is to provide an electronic retainer for preventing electromagnetic interference and capable of being absorbed mechanically. Therefore, the retainer can be absorbed by a robotic arm so that material-taking and assembly of the retainer is performed automatically. Thus, the manufacturing process is rapid and mass production can be achieved.

In order to achieve the aforesaid object, the present invention provides an electronic retainer for preventing electromagnetic interference and capable of being absorbed mechanically. The retainer has a through hole therein, and a temperature tolerant rubber piece is matched in the through hole.

The various objects and advantages of the present invention will be more readily understood from the following detailed description when reading in conjunction with the appended drawing.

BRIEF DESCRIPTION OF THE DRAWINGS

FIG. 7 is an exploded perspective view of the retainer in another embodiment of the present invention.

FIG. 8 is an exploded perspective view of the retainer in another embodiment of the present invention.

FIG. 9 is an assembled perspective view of the retainer in another embodiment of the present invention.

DETAILED DESCRIPTION OF THE PREFERRED EMBODIMENTS

Figure 1:
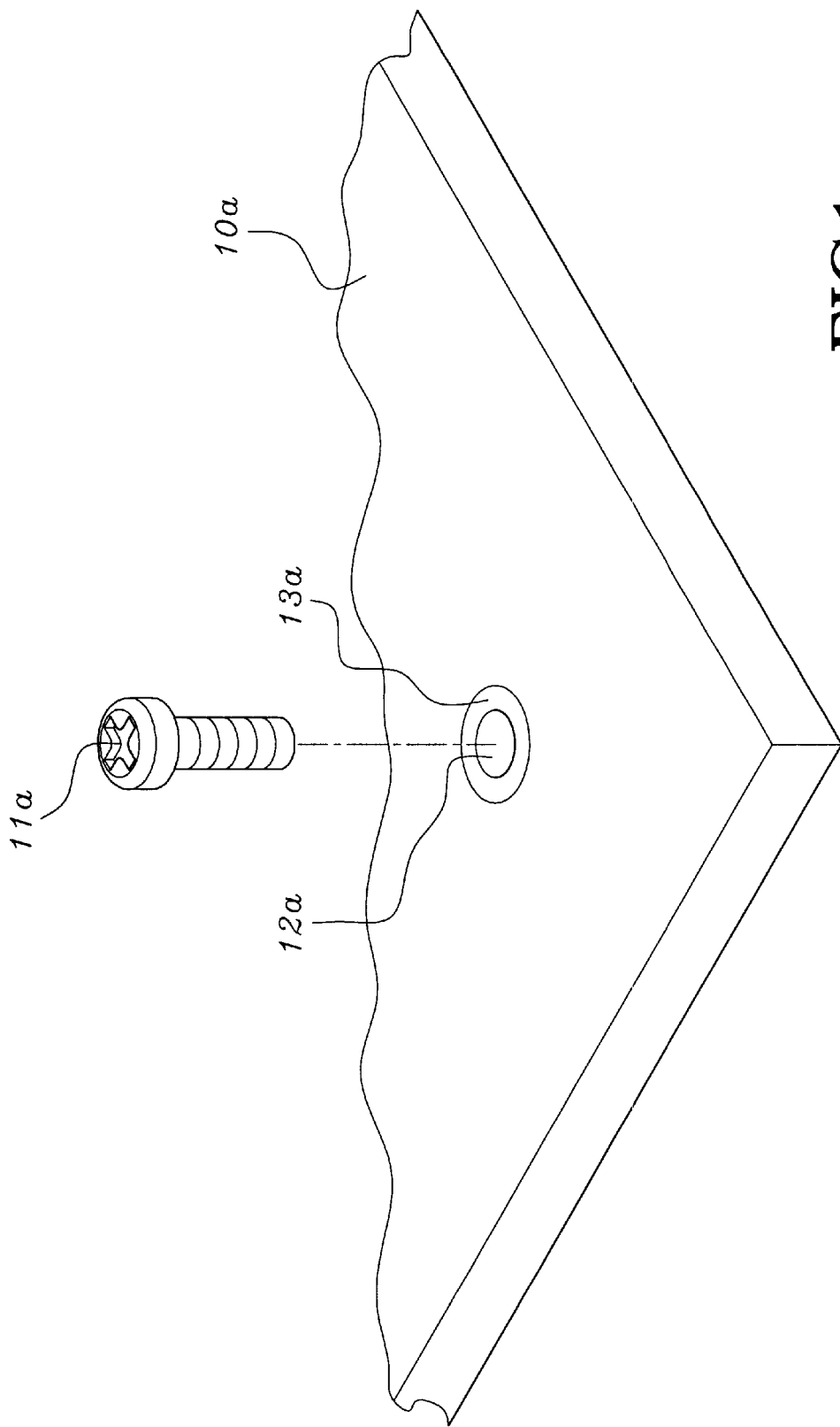
FIG. 1 is a schematic perspective view showing the fastening of a prior art circuit board.
Figure 2:
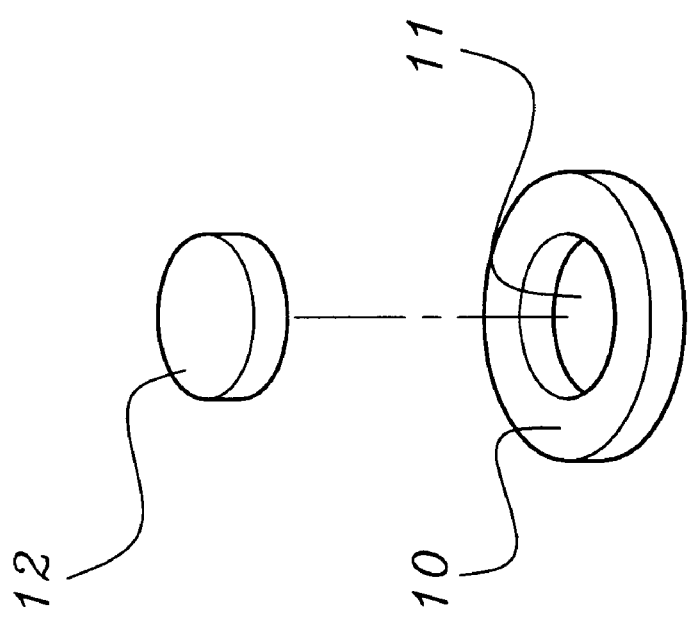
FIG. 2 is an exploded perspective view of the retainer in the present invention.
Figure 3:
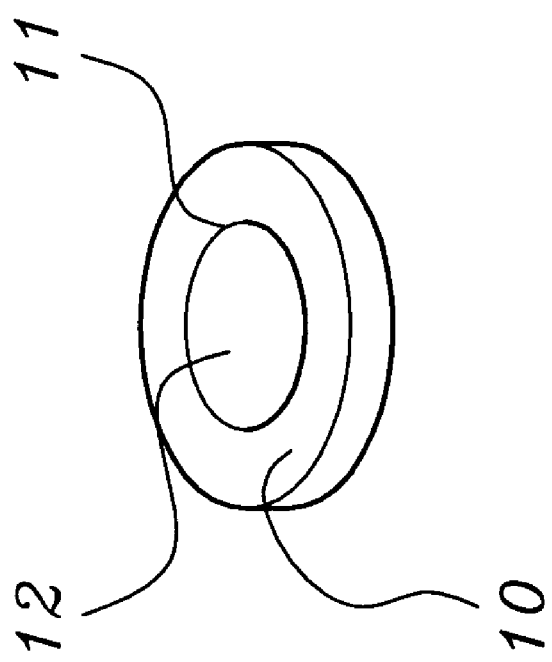
FIG. 3 is an assembled perspective view of the retainer in the present invention.

With reference to FIGS. 2 and 3, the retainer structure for preventing electromagnetic interference which is capable of being 'absorbed' mechanically (picked up by a vacuum pick up assembly) according the present invention is illustrated herein. The retainer 10 in the present embodiment is a washer made of a metal material and configured as a hollow ring. The inner part thereof is a round through hole 11. The bottom of the retainer 10 is coated with tin glue. A temperature tolerant rubber piece (silicon rubber) 12 is matched in the center of the through hole 11, which may tolerate a high temperature of 250 degrees C. through 30~60 seconds. The rubber piece 12 has a round shape with respect to the through hole 11 and is placed in the through hole 11 so that the retainer 10 has a solid central portion. By the aforesaid structure, the retainer of the present invention for preventing electromagnetic interference which is capable of being absorbed mechanically is formed.

In the present invention, the temperature tolerant rubber piece 12 is filled in the through hole 11 of the retainer 10 so that the retainer 10 has a solid central portion. Therefore, the retainer 10 can be absorbed by a robotic arm so that material-taking and assembly of the retainer 10 can be performed automatically. Thus, the manufacturing process is rapid and mass production can be achieved. In the manufacturing process, no manual operation is required. Thus, the assembly work can be formed by a lowest cost and works. Moreover, the yield ratio of the product can be increased greatly.

Figure 4:
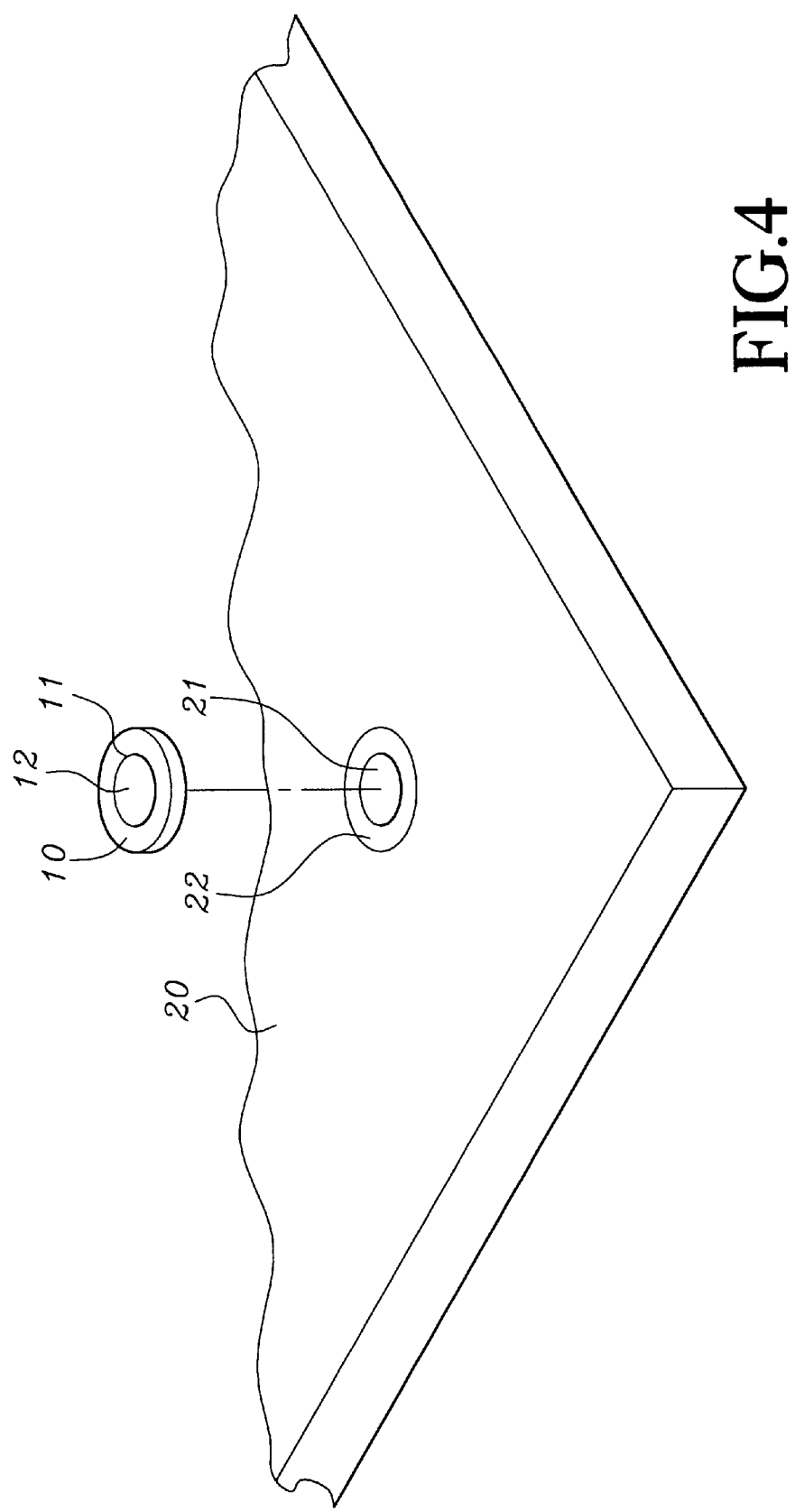
FIG. 4 is an exploded perspective view of the retainer and the circuit board in the present invention.
Figure 5:
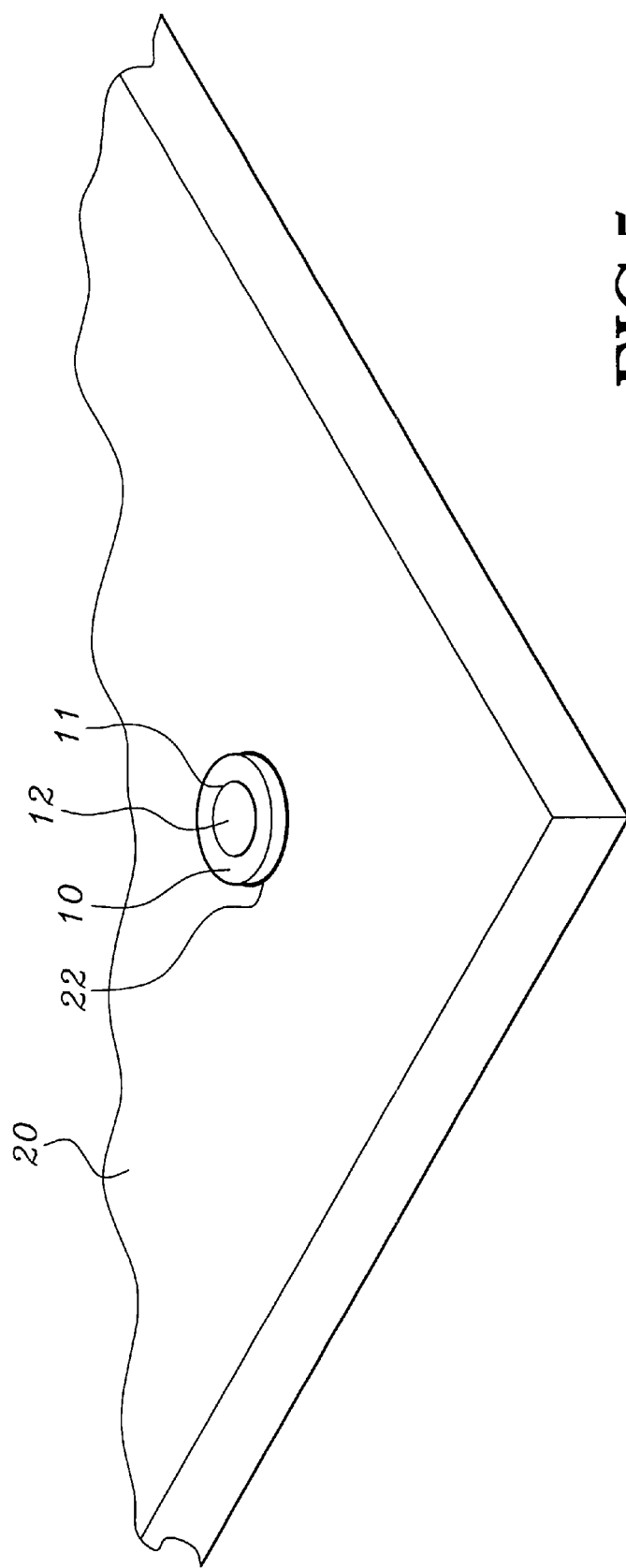
FIG. 5 is an assembled perspective view of the retainer and the circuit board in the present invention.

Referring to FIGS. 4 and 5, the retainer 10 can be absorbed by a robotic arm or other automatic device to be placed on the top of a circuit board 20 with respect to the fixing hole 21 and the tin ring 22 at an outer edge. Then the retainer 10 and the circuit board 20 are passed through a tin furnace. The retainer 10 is adhered to the circuit board 20 by the adhesion of the tin ring 22.

Figure 6:
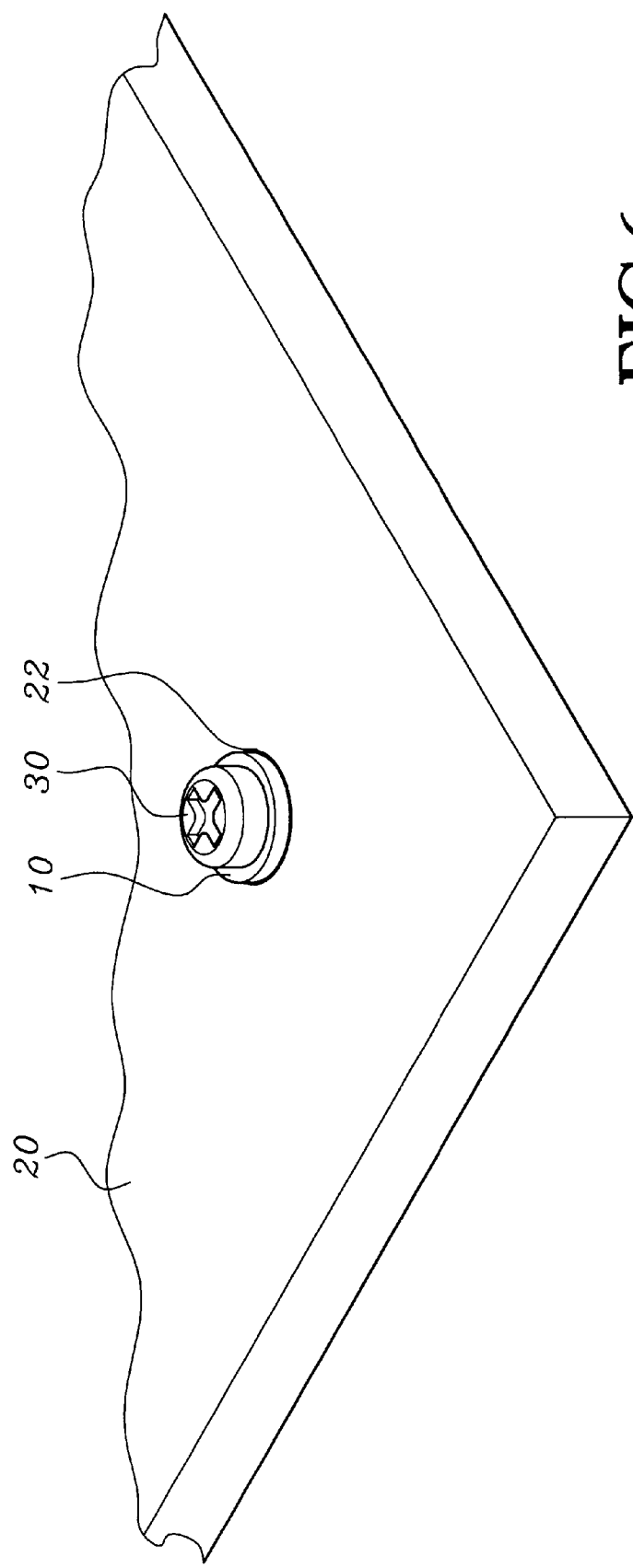
FIG. 6 is an assembled perspective view of the retainer, circuit board and screws in the present invention.

Referring to FIG. 6, in the present invention, the circuit board 20 can be fixed to the casing of an electronic device by a screw 30. Before screwing the screw 30, the temperature tolerant rubber piece 12 in the through hole 11 of the retainer 10 is removed firstly. Then, the screw 30 passes through the through hole 11 of the retainer 10 and the fixing hole 21 on the circuit board 20. Then the screw 30 is screwed to the casing (not shown) so that the circuit board 20 is fixed to the casing by the screw 30. Moreover, by contacting of the screw 30 with the retainer 10, the circuit board 10 may be electrically grounded through the tin ring 22, retainer 10, screw 30 and casing for achieving the object of preventing electromagnetic interference and thus the object of electromagnetic shielding is achieved.

The retainer 10 in the present invention can be fixed to the circuit board 20, which has the function of lifting the retainer. Moreover, the retainer 10 is placed between the screw 30 and the circuit board 20, as the screw 30 is rotated for fixing, it will not contact with an rub the tin ring 22 on the circuit board 20. Therefore, the tin ring will not be destroyed or drop out so that the circuit board 20 can be substantially electrically grounded through the tin ring 22, retainer 10, screw 30 and casing. Therefore, a preferred shielding effect is achieved.

With reference to FIG. 7, in the present invention, the bottom of the retainer 10 can be installed with two protruded fixing bodies 13 for forming a positioning structure. Furthermore, respective positioning grooves (positioning structure) 23 are installed on the circuit board 20. When the retainer 10 is placed on the circuit board 20, by the fixing bodies 13 to match with the positioning grooves 23, a guiding and positioning effect is provided so that the retainer 10 is accurately positioned on the circuit board 20.

Referring to FIGS. 8 and 9, in this embodiment, the retainer 40 is a nut. The retainer 40 is a round cylinder with unequal diameters from the center to the peripherals and having a hollow central portion. The interior thereof has a through hole 41. The through hole 41 is a threaded hole. A temperature tolerant rubber piece 42 is matched in the through hole 41 so that the retainer has a solid center. The retainer 40 can be absorbed by a robotic arm or other automatic device to be placed on the top of a circuit board 20 with respect to the fixing hole 21 and the tin ring 22 and an outer edge. The lower half of the retainer 40 is inserted into the fixing hole 21. Then the retainer 40 and the circuit board 20 pass through a tin furnace. The retainer 40 is firmly secured to the circuit board 20 through the tin ring 22. Then the temperature tolerant rubber piece 42 on the retainer 40 is removed so that the retainer 40 is locked to an electronic device on the circuit board 25 by screws.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An electromagnetic interference shielding retention apparatus for a fastener engaging an opening formed in a board substrate comprising: a board subtrated with an opening a retainer having a cylindrically shaped main portion with a hole formed therethrough corresponding in configuration to at least a portion of the board substrate opening, said main portion having a bottom surface for adherently engaging a tin ring layer disposed about the board substrate opening and an upper surface; and, a plug member having a planar upper surface of circular contour and being formed of a temperature tolerant rubber material, said plug member having a diameter corresponding to a diameter of said hole in said retainer and being inserted therein for forming a removable closure therefore, said upper surface of said plug member being disposed in coplanar relationship with said upper surface of said retainer, said plug member being configured to substantially seal said through hole when engaged therewith.

2. The electromagnetic interference shielding retention apparatus as recited in claim 1 wherein said plug member is formed of silicone rubber having a temperature tolerance sufficient to withstand a temperature of 250° C. for a time period of 30 to 60 seconds.

3. An electromagnetic interference shielding retention apparatus for a fastener engaging an opening formed in a board substrate, the opening having a plurality of radially extending positioning grooves formed in a perimeter portion thereof, said apparatus comprising: a board substrate with an opening a retainer having a cylindrically shaped main portion with a hole formed therethrough corresponding in configuration to at least a portion of the board substrate opening, said main portion having a bottom surface for adherently engaging a tin ring layer disposed about the board substrate opening, said retainer having a plurality of protruding bodies extending downwardly from said bottom surface of said main portion and protruding radially outwardly for respectively engaging said plurality of positioning grooves formed in the board substrate opening; and, a plug member formed of a temperature tolerant rubber material, said plug member having a portion thereof with a diameter corresponding to a diameter of said hole in said retainer for removably retaining said plug member therein and forming a removable closure therefore, said plug member being configured to substantially seal said through hole when engaged therewith.

4. An electromagnetic interference shielding retention apparatus for a fastener engaging an opening formed in a board substrate comprising: a board substrate with an opening a retainer having a cylindrically shaped main portion with a hole formed therethrough corresponding in configuration to at least a portion of the board substrate opening, said main portion having a bottom surface for adherently engaging a tin ring layer disposed about the board substrate opening and an upper surface, said hole in said retainer being threaded; and, a plug member formed of a temperature tolerant rubber material, said plug member having a portion thereof with a diameter corresponding to an internal diameter of said threaded hole in said retainer for removably retaining said plug member therein and forming a removable closure therefore, said plug member being configured to substantially seal said through hole when engaged therewith.

* * * * *